United States Patent [19]

Bosnyak

[11] Patent Number: 5,003,509
[45] Date of Patent: Mar. 26, 1991

[54] MULTI-PORT, BIPOLAR-CMOS MEMORY CELL

[75] Inventor: Robert J. Bosnyak, Tacoma, Wash.

[73] Assignee: National Semiconductor Corp., Santa Clara, Calif.

[21] Appl. No.: 500,083

[22] Filed: Mar. 27, 1990

[51] Int. Cl.⁵ .................... G11C 7/00; G11C 11/34; G11C 11/40; G11C 11/407
[52] U.S. Cl. ...................... 365/177; 365/190; 365/230.05; 365/191; 365/154
[58] Field of Search .............. 365/230.05, 154, 179, 365/174, 177, 190, 181, 191

[56] References Cited

U.S. PATENT DOCUMENTS

| | | | |
|---|---|---|---|
| 4,768,172 | 8/1988 | Sasaki | 365/230.05 |
| 4,860,263 | 8/1989 | Maltausch | 365/230.05 |
| 4,910,711 | 3/1990 | Guo | 365/177 X |
| 4,933,899 | 6/1990 | Gibbs | 365/230.03 X |

*Primary Examiner*—Alyssa H. Bowler
*Attorney, Agent, or Firm*—Limbach, Limbach & Sutton

[57] ABSTRACT

A multi-port, BI-CMOS memory cell is disclosed having a CMOS flip-flop, one or more write ports gated by n-channel FETs, and one or more ECL read ports. Bipolar transistors in the read port are resistively interconnected to equalize emitter voltages during write and standby operations and to resistively isolate the emitters during a read operation.

9 Claims, 6 Drawing Sheets

MULTI-PORT, BIPOLAR-CMOS MEMORY CELL

BACKGROUND OF THE INVENTION

1. Field of the Invention

This invention relates generally to random access memory circuits, and relates more particularly to a multi-port memory cell using both bipolar and CMOS transistors.

2. Description of the Relevant Art

A memory cell is an electronic circuit in which a bit (binary digit) of information can be stored. Means are provided for writing a bit into the memory cell and for later reading that bit. Often it is useful to provide multiple read ports and multiple write ports, all independent of each other. This permits simultaneous access to more than one memory cell or groups of memory cells, thereby improving CPU access to data and decreasing the time required for CPU operations.

A typical prior art multi-port memory cell 10, shown in FIG. 1, can be implemented with binary transistors in an ECL (emitter-coupled logic) circuit. Transistors 12 and 14 form a flip-flop that stores data, with stand-by current supplied through resistors 16 and 18 from a voltage source, $V_{ref}$. Write and read operations are accomplished by steering current through differentially connected bipolar transistors. During a write operation, transistors 20 and 22 are enabled by WRITE ROW. One of the transistors 20 and 22 turns on, depending on the state of complementary DATA IN lines, and diverts the stand-by current, thus writing data to the memory cell as controlled by the DATA IN lines. The read circuitry includes transistors 24 and 26, which form a differential cascode sensing circuit in combination with a sense amplifier (not shown) that drives the complementary DATA OUT lines and the collectors of transistors 24 and 26 to a relatively constant voltage. During a read operation, transistors 24 and 26 are enabled by READ ROW, turning one of the transistors on, depending on the state of the memory cell. The sense amp senses differential current flowing through the DATA OUT lines, as caused by transistors 24 and 26.

The memory cell of FIG. 1 works fairly well as the memory size increases, even though the sense line capacitance increases, because the delta voltage between the collectors of transistors 24 and 26 is small. Additional read and write ports can readily be added to this memory cell. In a practical circuit, however, degenerating emitter resistors should be added to prevent current hogging between cells. Although this is a high speed memory cell due to its ECL circuitry, it requires substantial power since power is used to retain the data during standby, and power is used for both read and write operations.

Another prior art multi-port memory cell 30, shown in FIG. 2, utilizes both bipolar transistors and complementary metal-oxide semiconductor field-effect transistors (CMOS). The CMOS flip-flop includes two cross-coupled pairs of complementary MOSFET transistors 32, 34, 36 and 38 that are interconnected to form two complementary data storage nodes. Writing to the memory cell is accomplished by enabling WRITE ROW, which turns on transistors 40 and 42, thereby writing the data on the complementary DATA IN lines to the storage nodes. Reading from the cell is accomplished by two bipolar transistors 44 and 46, one of which turns on to drive its corresponding DATA OUT line.

In a few respects, the memory cell 30 of FIG. 2 is an improvement over the memory cell 10 of FIG. 1. Memory cell 30 reduces the amount of current required to store data because the CMOS flip-flop requires only gate leakage current to retain its state. Additional ports can easily be added to memory cell 30. Although it has a high speed read path, using inherently fast bipolar transistors, the read operation is slowed because the bipolar transistors are driven by "slow" p-channel FETs 32 and 36. The p-channel FETs also slow the write operation. Another drawback to memory cell 30 is that READ ROW must swing by at least 600–800 mv, so that the voltage across the memory cell at standby is less than the full supply. This situation lessens noise immunity and increases sensitivity to alpha events.

A related memory cell 50, shown in FIG. 3, also has a CMOS flip-flop structure, but is single-ended for both read and write. Although simpler than cell 30, memory cell 50 suffers from the additional drawbacks of requiring a reference for read operations, and having poor common mode rejection of spurious signals.

SUMMARY OF THE INVENTION

In accordance with the illustrated preferred embodiment, the present invention provides a BI-CMOS memory cell composed of both bipolar and CMOS transistors arranged in three functional units: a flip-flop cell, one or more write ports, and one or more read ports. The flip-flop cell consists of two pairs of complementary field-effect transistors interconnected to form a memory cell having two complementary data storage nodes. Each write port includes two field-effect transistors respectively coupled between complementary data-in lines and the data storage nodes of the flip-flop cell. The transistors of the write port are enabled by a write-enable control line when writing data to the memory cell.

Each read port includes two bipolar transistors and two field-effect transistors coupled between complementary data-out lines and the data storage nodes of the flip-flop. The FET transistors of the read port are enabled by a read-enable control line when reading data from the memory cell. Each read port further includes resistive means for resistively interconnecting the emitters of the bipolar transistors to equalize emitter voltages during write and standby operations and to resistively isolate the emitters during a read operation.

The memory cell of the present invention surmounts many of the problems associated with merging CMOS and bipolar technologies in a multi-port memory cell. The full voltage supply is applied to the memory cell, thus improving noise immunity and alpha sensitivity. The CMOS flip-flop cell requires little power during stand-by to retain data. Write through recovery is fast due to the use of n-channel devices. The memory cell has ECL bipolar circuitry in a cascode configuration for high speed read operations. Additional read or write ports can readily be added. The memory cell also exhibits good common mode rejection of spurious signals.

The features and advantages described in the specification are not all inclusive, and particularly, many additional features and advantages will be apparent to one of ordinary skill in the art in view of the drawings, specification and claims hereof. Moreover, it should be noted that the language used in the specification has been principally selected for readability and instructional

DETAILED DESCRIPTION OF THE PREFERRED EMBODIMENTS

Figure 1:
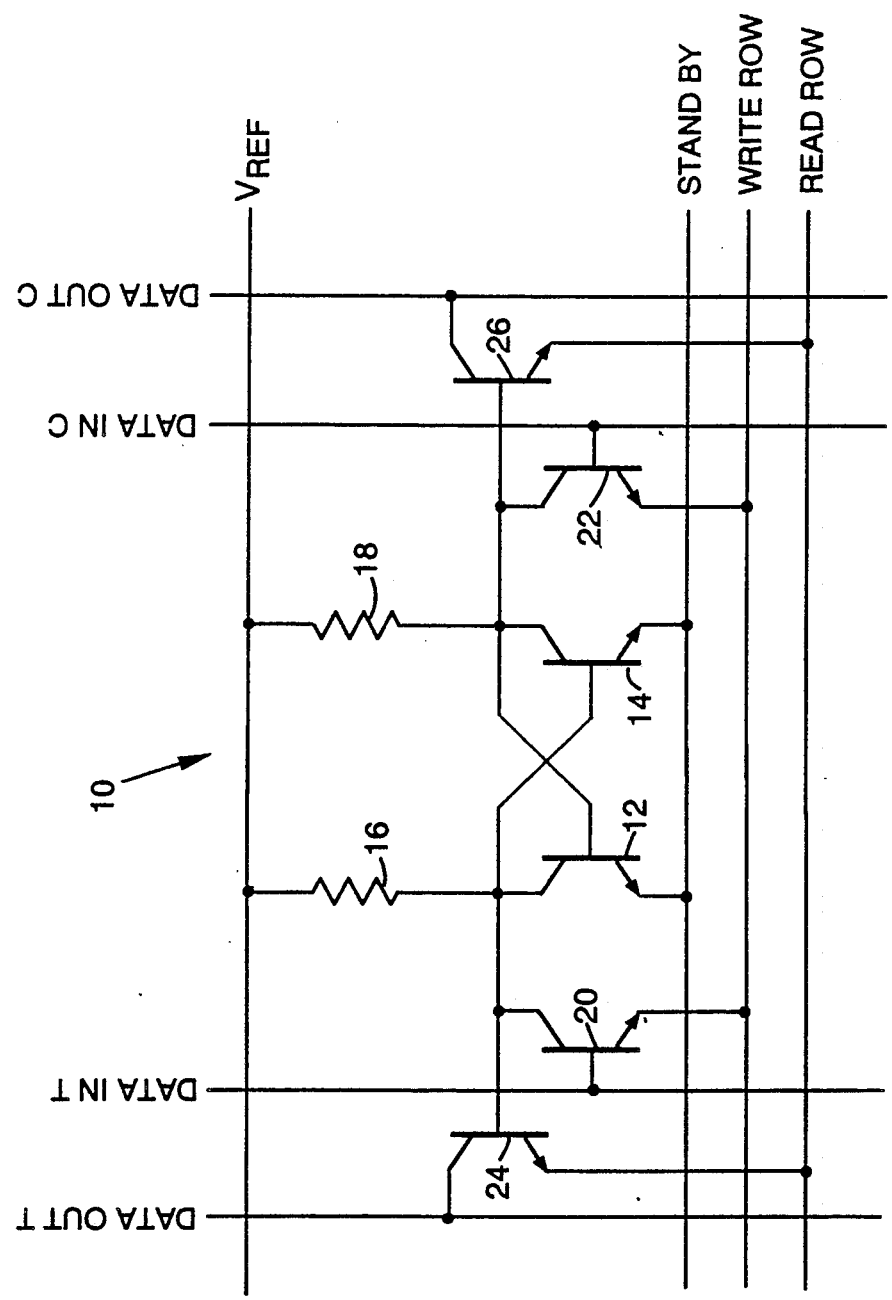
FIG. 1 is a schematic circuit drawing of a prior art memory cell.
Figure 2:
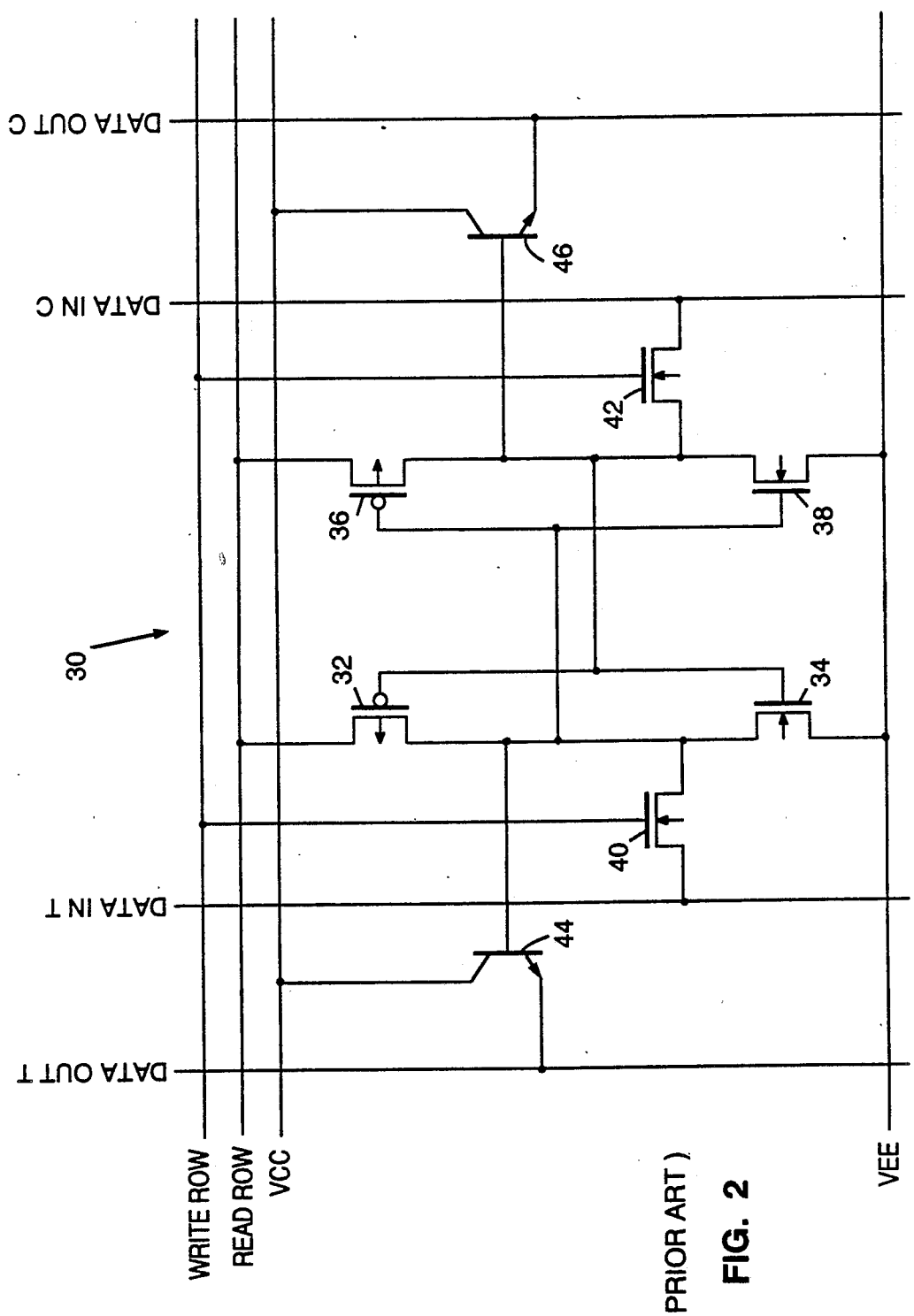
FIG. 2 is a schematic circuit drawing of another prior art memory cell.
Figure 3:
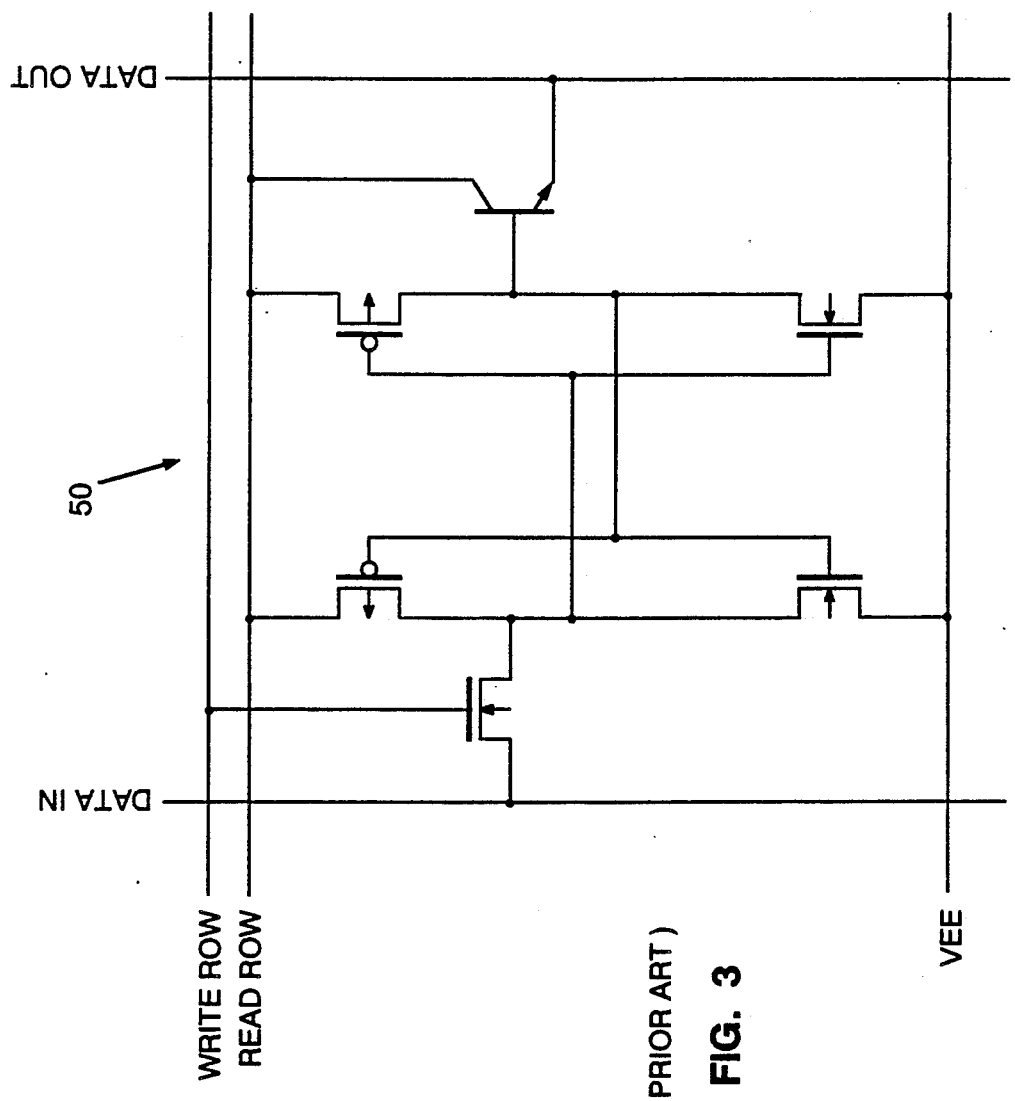
FIG. 3 is a schematic circuit drawing of still another prior art memory cell.
Figure 4:
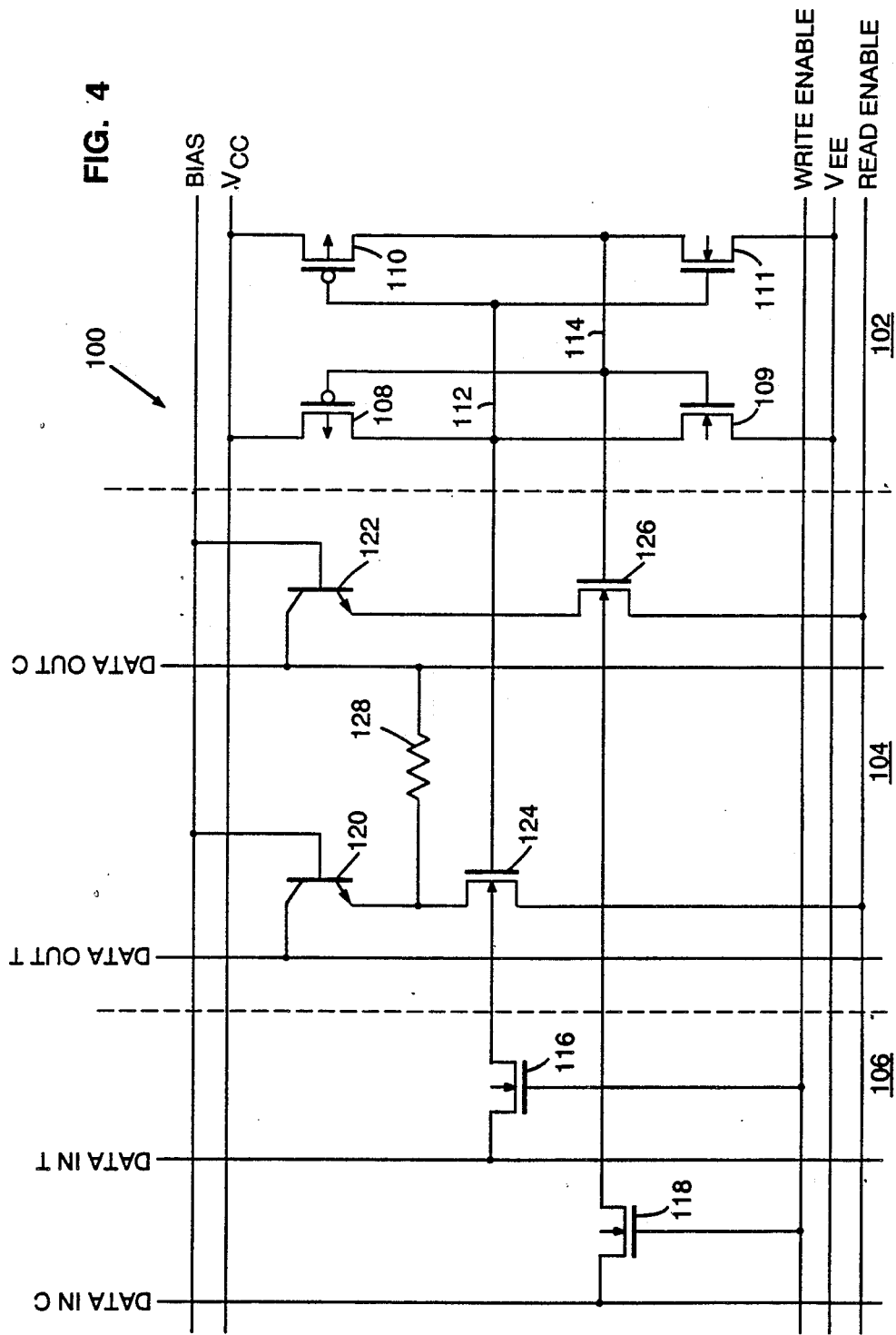
FIG. 4 is a schematic circuit drawing of a memory cell according to the present invention
Figure 5:
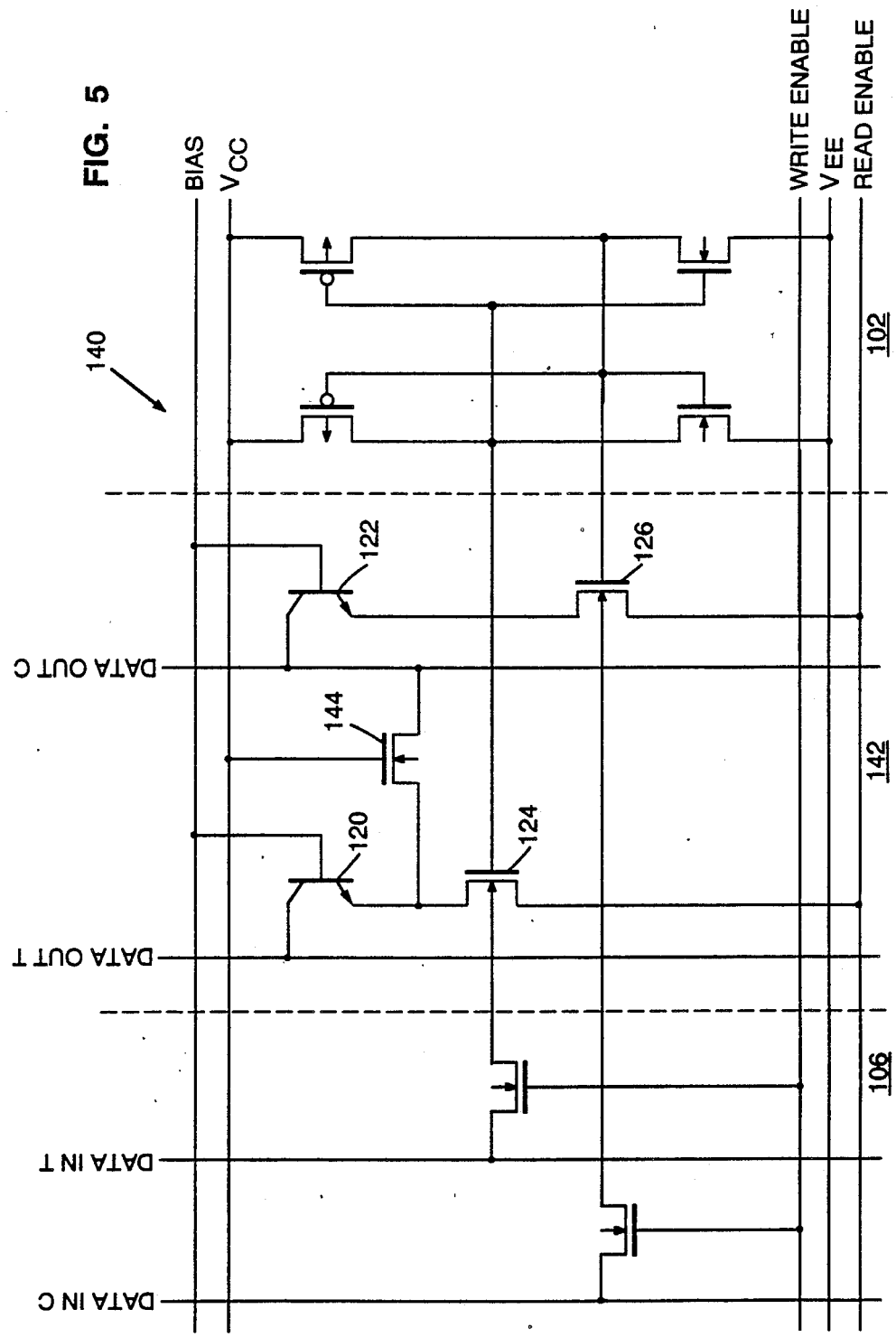
FIG. 5 is a schematic circuit drawing of a memory cell according to another embodiment of the present invention.
Figure 6:
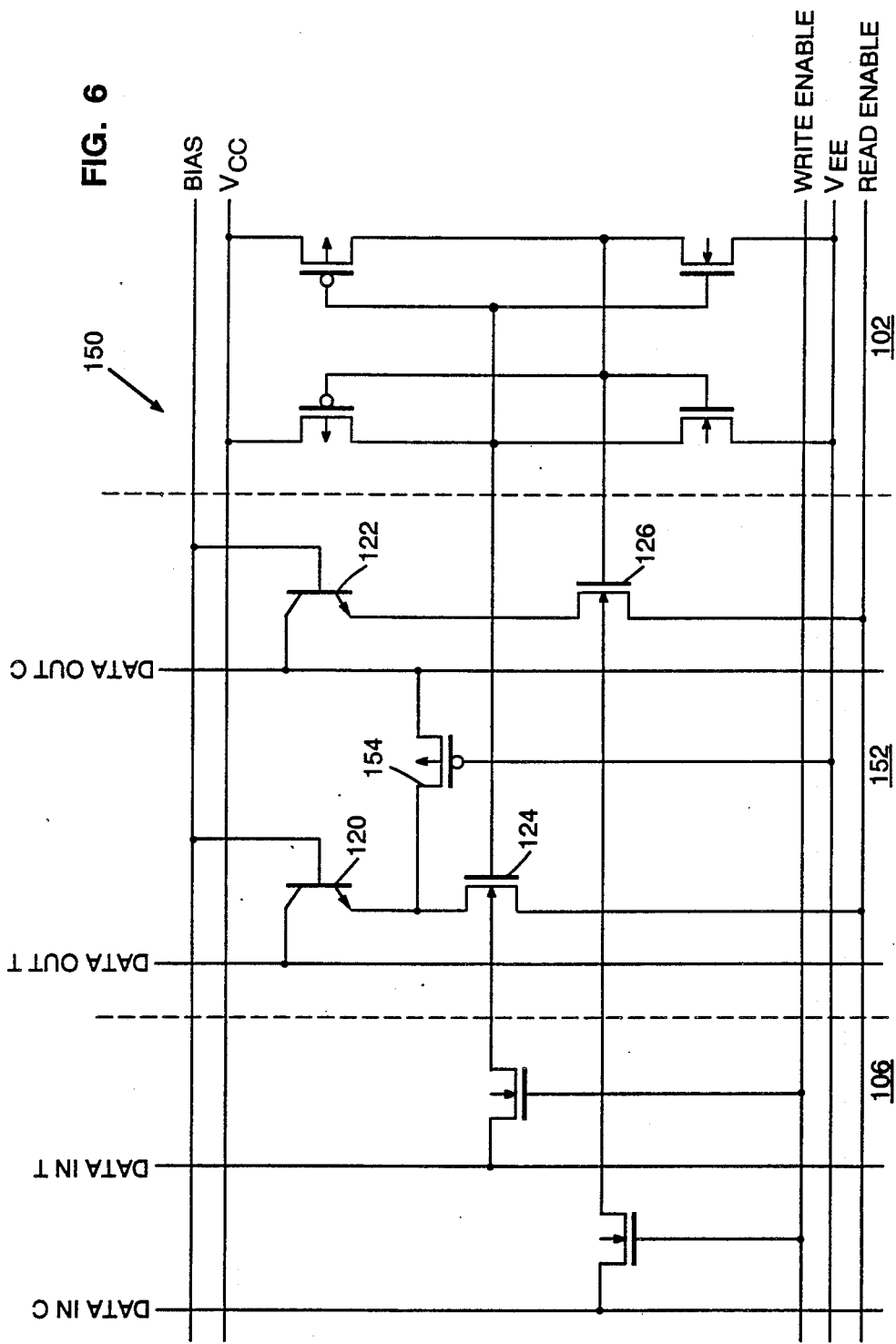
FIG. 6 is a schematic circuit drawing of a memory cell according to still another embodiment of the present invention.

FIGS. 4 through 6 of the drawings depict various preferred embodiments of the present invention for purposes of illustration only. One skilled in the art will readily recognize from the following discussion that alternative embodiments of the structures and methods illustrated herein may be employed without departing from the principles of the invention described herein.

The preferred embodiment of the present invention is a multi-port memory cell using both bipolar and CMOS transistors. One of the preferred embodiments, memory cell 100, is illustrated in FIG. 4. Memory cell 100 consists of a CMOS flip-flop cell 102, one or more read ports 104, and one or more write ports 106.

The CMOS flip-flop cell 102 is the memory element for the memory cell 100. The flip-flop cell 102 includes two pairs of complementary field-effect transistors 108-109 and 110-111. Both pairs include a p-channel field-effect transistor having its drain connected to a positive voltage supply line $V_{cc}$ and its source connected to the drain of an n-channel field-effect transistor, which in turn has its source connected to a negative voltage supply line $V_{ee}$. The gates of each pair of field-effect transistors are connected together and are also connected to the drain-source connection of the other pair, forming a data node. In operation, one p-channel FET and the n-channel FET for the opposite pair will be conductive. The conductive p-channel FET forces one data node to $V_{cc}$, while the conductive n-channel FET forces the other data node to $V_{ee}$. Each data node 112 and 114 will have a voltage of either $V_{cc}$ or $V_{ee}$, depending on which transistors are conductive. The flip-flop cell 102 thus defines two states.

The write port 106 has two field-effect transistors 116 and 118 that are interconnected between the flip-flop cell 102 and DATA IN lines. Transistor 116 has its drain and source connected between data node 112 and a DATA IN T (true) line, while transistor 118 has its drain and source connected between data node 114 and a DATA IN C (complement) line. Both transistors 116 and 118 have their gates connected to a WRITE ENABLE line. A write operation occurs when the WRITE ENABLE line is pulled high, thus turning on transistors 116 and 118 and allowing the complementary data contained on the DATA IN lines to pass through to the data nodes 112 and 114.

The read port 104 includes two bipolar transistors 120 and 122, two field-effect transistors 124 and 126, and a resistor 128. Each FET is paired with a bipolar transistor, and each transistor pair is coupled between a DATA OUT line and a data storage node of the flip-flop 102. Each bipolar transistor 120 and 122 has its collector connected to a DATA OUT line and its base connected to a BIAS line. The voltage of the BIAS line is less than $V_{cc}$ and greater than $V_{ee}$. The emitter of each bipolar transistor 120 and 122 is connected through a field-effect transistor 124 and 126, respectively, to a READ ENABLE line. The gates of the FET's 124 and 126 are respectively connected to data nodes 112 and 114. Resistor 128 is connected between the emitters of transistors 120 and 122.

During stand-by and write operations, the read port 104 is not in use and the READ ENABLE line is allowed to float. One of the two FETs 124 or 126 is on, depending on the state of the flip-flop cell 102. Whichever FET is on allows the READ ENABLE line to come up to a voltage that is one diode drop below the voltage of the BIAS line. The resistor 128 equalizes the voltages at the emitters of bipolar transistors 120 and 122.

During a read operation, the READ ENABLE line is pulled low. One of the field-effect transistors 124 or 126 is on and the other is off, depending on the state of the flip-flop 102. The on transistor 124 or 126 pulls its connected emitter low, thus turning its corresponding bipolar transistor 120 or 122 on hard. The other bipolar transistor is off or nearly off because the resistor 128 in effect isolates that emitter from the low voltage of the READ ENABLE line. The resistor 128 and the on transistor 124 or 126 form a voltage divider that determines the voltage at the emitter of the "off" bipolar transistor. The difference in conductance of the two bipolar transistors 120 and 122 is sensed by a sense amplifier (not shown) connected as a cascode element.

Another embodiment 140 of the memory cell invention is illustrated in FIG. 5. The flip-flop cell 102 and write port 106 are the same a described above, as is most of the read port 142. The difference is that resistor 128 has been replaced by an n-channel field effect transistor 144, with its source and drain connected between the emitters of transistors 120 and 122 and the gate connected to $V_{cc}$. The n-channel transistor 144 is always on, allowing the voltages at the emitters to equalize during stand-by and write operations. During read operations, transistor 144 acts as a resistive element in the resistor divider so that one of the two bipolar transistors 120 and 122 will be more conductive than the other.

Another embodiment 150 of the memory cell invention is illustrated in FIG. 6. The flip-flop cell 102 and write port 106 are the same a described above, as is most of the read port 152. The difference is that the resistive element is a p-channel field effect transistor 154, with its source and drain connected between the emitters of transistors 120 and 122 and the gate connected to $V_{ee}$. The p-channel transistor 154 is always on, allowing the voltages at the emitters to equalize during stand-by and write operations. During read operations, transistor 154 acts as a resistive element in the resistor divider so that one of the two bipolar transistors 120 and 122 will be more conductive than the other.

In any of the three embodiments, additional read or write ports can be provided by adding the appropriate data and control lines and interconnecting transistors.

From the above description, it will be apparent that the invention disclosed herein provides a novel and advantageous multi-port memory cell using both bipolar and CMOS transistors. The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

What is claimed is:

1. A memory cell circuit for use in a memory circuit having two voltage supply lines, a bias voltage line, two complementary data-in lines, two complementary data-out lines, a read-enable control line, and a write-enable control line, said memory cell circuit comprising:
   a CMOS flip-flop having two pairs of complementary field-effect transistors interconnected between the voltage supply lines to form a memory cell having two complementary data storage nodes;
   a write port including two field-effect transistors each having a gate, a source, and a drain, and respectively coupled between the complementary data-in lines and the two complementary data storage nodes of the flip-flop, wherein the gates of both transistors of the write port are coupled to the write-enable control line; and
   a read port including two bipolar transistors each having a base, a collector, and an emitter, and having their collectors respectively coupled to the two complementary data-out lines and their bases both coupled to the bias voltage line, including two field-effect transistors respectively coupled between the emitters of the bipolar transistors and the read-enable control line, wherein the gates of the field-effect transistors of the read port are respectively coupled to the two complementary data storage nodes of the flip-flop, and including resistive means for resistively interconnecting the emitters of the bipolar transistors of the read port.

2. A memory cell circuit as recited in claim 1 wherein the resistive means for interconnecting the emitters of the bipolar transistors of the read port includes a resistor coupled between the two emitters.

3. A memory cell circuit as recited in claim 1 wherein the resistive means for interconnecting the emitters of the bipolar transistors of the read port includes a field-effect transistor coupled between the two emitters and biased to be conductive.

4. A memory cell circuit as recited in claim 3 wherein the field effect transistor coupled between the two emitters is an n-channel MOSFET transistor having a gate, a source and a drain, and having its drain and source coupled between the two emitters and its gate coupled to the more positive of the voltage supply lines.

5. A memory cell circuit as recited in claim 3 wherein the field effect transistor coupled between the two emitters is a p-channel MOSFET transistor having its drain and source coupled between the two emitters and its gate coupled to the more negative of the voltage supply lines.

6. A memory cell circuit as recited in claim 1 wherein the field-effect transistors of the write port and the read port are n-channel MOSFET transistors.

7. A memory cell circuit as recited in claim 1 further comprising one or more additional write ports, each additional write port including two field-effect transistors coupled between the complementary data-in lines and respective complementary data storage nodes of the flip-flop, wherein the gates of each such transistor are coupled to and controlled by the write-enable control line.

8. A memory cell circuit as recited in claim 1 further comprising one or more additional read ports, each additional read port including two bipolar transistors each having a base, a collector and an emitter, and having their collectors coupled to respective complementary data-out lines and their bases coupled to the bias voltage line, including two field-effect transistors each having a gate, a source and a drain, and coupled between respective emitters of the bipolar transistors and the read-enable control line, wherein the gates of the field-effect transistors are coupled to respective complementary data storage nodes of the flip-flop, and including resistive means for interconnecting the emitters of the bipolar transistors of the read port.

9. A memory cell circuit comprising:
   two complementary voltage supply lines;
   a CMOS flip-flop having two pairs of complementary MOS transistors having a gate, a source, and a drain, and interconnected between the two complementary power lines to form a memory cell with two complementary data storage nodes;
   two complementary data-in lines;
   a write-enable control line;
   a write port including two field-effect transistors each having a gate, a source and a drain and coupled between the complementary data-in lines and respective complementary data storage nodes of the flip-flop, wherein the gates of each transistor are coupled to and controlled by the write-enable control line;
   two complementary data-out lines;
   a bias-voltage line;
   a read-enable control line; and
   a read port including two bipolar transistors having a base, a collector and an emitter, and having their collectors coupled to respective complementary data-out lines and their bases coupled to the bias voltage line, including two field-effect transistors each having a gate, a source, and a drain, and coupled between respective emitters of the bipolar transistors and the read-enable control line, wherein the gates of the field-effect transistors are coupled to respective complementary data storage nodes of the flip-flop, and including resistive means for interconnecting the emitters of the bipolar transistors.

* * * * *